United States Patent
Keshavarz Akhlaghi et al.

(10) Patent No.: US 11,261,085 B2
(45) Date of Patent: Mar. 1, 2022

(54) METHODS FOR MICRO AND NANO FABRICATION BY SELECTIVE TEMPLATE REMOVAL

(71) Applicant: NANOTECH SECURITY CORP., Burnaby (CA)

(72) Inventors: Mohsen Keshavarz Akhlaghi, North Vancouver (CA); Clinton K. Landrock, North Vancouver (CA)

(73) Assignee: Nanotech Security Corp., Burnaby (CA)

( * ) Notice: Subject to any disclaimer, the term of this patent is extended or adjusted under 35 U.S.C. 154(b) by 0 days.

(21) Appl. No.: 16/084,214

(22) PCT Filed: May 2, 2018

(86) PCT No.: PCT/CA2018/050519
§ 371 (c)(1),
(2) Date: Sep. 11, 2018

(87) PCT Pub. No.: WO2018/201248
PCT Pub. Date: Nov. 8, 2018

(65) Prior Publication Data
US 2019/0292047 A1    Sep. 26, 2019

Related U.S. Application Data

(60) Provisional application No. 62/500,530, filed on May 3, 2017.

(51) Int. Cl.
*B81C 99/00* (2010.01)
*B29C 41/02* (2006.01)
(Continued)

(52) U.S. Cl.
CPC .......... *B81C 99/0085* (2013.01); *B29C 41/02* (2013.01); *B81C 1/00031* (2013.01);
(Continued)

(58) Field of Classification Search
CPC . B81C 99/0085; B81C 1/00031; B82Y 40/00; B29C 41/02; B42D 25/40;
(Continued)

(56) References Cited

U.S. PATENT DOCUMENTS 6,652,700 B1   11/2003   Namikawa et al.
7,713,053 B2    5/2010   Mick et al.
(Continued)

FOREIGN PATENT DOCUMENTS

CA       2928598          6/2015
DE   WO 2017/021461   *  2/2017   ........... B42D 25/378
(Continued)

OTHER PUBLICATIONS

International Search Report for PCT/CA2018/050519.
(Continued)

*Primary Examiner* — Timothy Kennedy
*Assistant Examiner* — Olukorede Esan
(74) *Attorney, Agent, or Firm* — Fish & Richardson P.C.

(57) ABSTRACT

A method to remove selected parts of a thin-film material otherwise uniformly deposited over a template is disclosed. The methods rely on a suitable potting material to encapsulate and snatch the deposited material on apexes of the template. The process may yield one and/or two devices during a single process step: (i) thin-film material(s) with micro- and/or nano-perforations defined by the shape of template apexes, and (ii) micro- and/or nano-particles shaped and positioned in the potting material by the design of the template apexes. The devices made from this method may find applications in fabrication of mechanical, chemical, electrical and optical devices.

10 Claims, 5 Drawing Sheets

(51) Int. Cl.
   *B82B 3/00*       (2006.01)
   *B81C 1/00*       (2006.01)
   *H01L 31/0224*    (2006.01)
   *G02B 5/18*       (2006.01)
   *B82Y 40/00*      (2011.01)
   *B42D 25/36*      (2014.01)
   *B42D 25/40*      (2014.01)

(52) U.S. Cl.
   CPC .... *B82B 3/0033* (2013.01); *H01L 31/022425* (2013.01); *B42D 25/36* (2014.10); *B42D 25/40* (2014.10); *B81B 2203/0353* (2013.01); *B81B 2203/0361* (2013.01); *B81B 2207/056* (2013.01); *B82Y 40/00* (2013.01); *G02B 5/1809* (2013.01)

(58) Field of Classification Search
   CPC .................. B42D 25/36; B82B 3/0033; B81B 2203/0361; B81B 2203/0353
   See application file for complete search history.

(56) References Cited

U.S. PATENT DOCUMENTS

| | | | |
|---|---|---|---|
| 2007/0158872 A1* | 7/2007 | Jeong | B82Y 10/00 264/220 |
| 2007/0218398 A1* | 9/2007 | Ito | C07F 7/1804 430/141 |
| 2009/0286379 A1* | 11/2009 | Hong | B82Y 10/00 156/247 |
| 2011/0195141 A1 | 8/2011 | Muhammad et al. | |
| 2012/0016160 A1 | 1/2012 | Leung et al. | |
| 2014/0242331 A1* | 8/2014 | Yoon | B29C 67/202 428/137 |
| 2014/0242744 A1* | 8/2014 | Fonash | H01L 31/02327 438/71 |
| 2015/0191003 A1 | 7/2015 | Novotny et al. | |
| 2016/0023400 A1* | 1/2016 | Chung | G03F 7/0002 264/446 |
| 2018/0215190 A1* | 8/2018 | Reuther | B32B 15/08 |

FOREIGN PATENT DOCUMENTS

| | | | | |
|---|---|---|---|---|
| DE | WO 2017/021461 A1 * | 2/2017 | ............ | B32B 15/08 |
| EP | 1341655 | 9/2003 | | |
| WO | 2002/043937 | 6/2002 | | |
| WO | WO2009/088357 A1 | 7/2009 | | |
| WO | 2012/023724 | 2/2012 | | |

OTHER PUBLICATIONS

Written Opinion for PCT/CA2018/050519.
Sohrabi Foozieh, et al., "Fabrication methods of plasmonic and magnetoplasmonic crystals: a review", The European Physical Journal Plus, Springer Berlin Heidelberg, vol. 132, No. 1, Jan. 17, 2017, pp. 1-21.
Extended European Search Report and Opinion for corresponding European Patent Application No. 18794090.3 dated Dec. 18, 2020, 7 pages.
Sozo Yokogawa et al., "Plasmonic Color Filters for CMOS Image Sensor Applications," Nano Letters, 2012, 12, pp. 4349-4354.
Yun Seon Do et al, "Plasmonic Color Filter and its Fabrication for Large-Area Applications," Advanced Optical Materials, 2013, 1, pp. 133-138.
Hong-Shik Lee et al., "Color filter based on a subwavelength patterned metal grating," Optics Express, 2007, vol. 15, pp. 15457-15463.
Jacson W. Menezes et al, "Large Area Fabrication of Periodic Arrays of Nanoholes in Metal Films and Their Application in Biosensing and Plasmonic-Enhanced Photovoltaics," Advanced Functional Materials, 2010, 20, pp. 3918-3924.
Wade A. Luhman et al., "Self-assembled plasmonic electrodes for high-performance organic photovoltaic cells," Applied Physics Letters, 99, 103306, 2011, 4 pages.
A. Cattoni et al., "$\lambda^3$/1000 Plasmonic Nanocavities for Biosensing Fabricated by Soft UV Nanoimprint Lithography, Nano Letters, 2011, 11, pp. 3557-3563.
J. Henzie et al., "Multiscale patterning of plasmonic metamaterials," Nature Nanotechnology, 2007, vol. 2, pp. 549-554.
N. Kooy et al., "A review of roll-to-roll nanoimprint lithography," Nanoscale Research Letters., 2014, 9, 13 pages.
Lee et al., "Enhancing Surface Plasmon Detection Using Template-Stripped Gold Nanoslitt Arrays on Plastic Films," ACS Nano, 2012, vol. 6, No. 4, pp. 2931-2939.
Si Hoon Lee et al., "Linewidth Optimized Extraordinary Optical Transmission in Water with Template-Stripped Metallic Nanohole Arrays," Advanced Functional Materials, 2012, 22, pp. 4439-4446.
Ana Zehtabi-Oskuie et al., "Template stripped double nanohole in a gold film for nano-optical tweezers," Nanotechnology, 2014, 25, 495301, 6 pages.
Prashant Nagpal et al., "Ultrasmooth Patterned Metals for Plasmonics and Metamaterials," Science, 2009, vol. 325, pp. 594-597.
Examination Report from corresponding Indian Application No. 201917044527 dated Mar. 8, 2021, 6 pages.

\* cited by examiner

METHODS FOR MICRO AND NANO FABRICATION BY SELECTIVE TEMPLATE REMOVAL

FIELD

The present invention relates generally to methods of fabrication of micro and nano-structures. More particularly, the present invention relates to methods of fabrication of micro and nano-structures using selective removal of a thin-film material deposited on a micro or nano-structure template.

BACKGROUND

In conventional micro- and nano-fabrication, there are variety of cases in which a specific patterned thin-film material may need to be made. Examples may include production of micro- or nano-structure patterned thin-film electrical contacts on an electronic chip; micro- or nano-structure patterned perforated metallic film(s) in a plasmonic device; micro- or nano-structure textured electrodes for photo-voltaic cells, plasmonic devices, metamaterial devices, optical filters, bio-sensors, gas detectors, optical polarizers, displays, document security features, among many others.

In conventional micro- and nano-fabrication, there are also a variety of cases in which a specific spatial arrangement of precisely shaped micro- or nano-particles may need to be made. Examples may include production of micro- or nano-particles and structures as may be used in such applications as those listed above.

There are conventionally known methods that rely on established micro- or nano-fabrication processes that may provide for fabrication of micro- or nano-structures as may be used in such applications as those listed previously. Typically such conventional processes are often utilized for manufacturing many individual and separate small devices on a shared large wafer (e.g. silicon wafer). The total fabrication cost of producing a micro- or nano-structured wafer will be divided among the many separate individual devices that are manufactured on the same wafer; and therefore the cost of conventional manufacture of each device is typically defined by the cost per area of the wafer containing multiples of those conventional small devices.

However, there are cases in which the final micro- or nano-structure based device need to be large (such as for example >1 cm$^2$) in area. Using conventional known wafer-scale micro- or nano-fabrication methods will typically make such large area devices undesirably or unfeasibly expensive for many potential applications. For example, a plasmonic color filter may comprise a 30 nm metal film perforated with 100 nm diameter holes periodically arranged in a lattice of 200 nm pitch or periodicity. As an example, the desired size of a plasmonic-based color filter should be in the range of ~25 cm$^2$ area for lighting or photography applications, the filtering efficiency should be high, and a desired price for such applications should be low (perhaps $1 per filter or less). If the filter is to be disposable, a high volume (millions or billions) of such devices should be reasonably produced. Such a relatively large area and relatively inexpensive price per device may not be possible using conventionally known fabrication processes where the cost of such a nano-structured filter device may typically be one or more orders of magnitude higher than desired for such an application.

In one conventional method, optical lithography may be used to make micro- or nano-structures in a thin-film material. The process typically involves: (i) optical resist coating, exposure, and development steps, (ii) thin-film material coating steps, and (iii) steps (e.g. wet etching, dry etching, and lift-off) to transfer patterns of the resist to the thin-film. In optical lithography many wafers can be patterned using a single often expensive optical mask; therefore the cost of the mask is divided among the many final patterned wafers, though the cost per unit area of the final wafer may still remain significantly higher than that which is desired due to the many steps that are required to pattern a final device. Also, the optical lithography often covers a range of minimum feature sizes larger than what may typically be needed for such applications as those listed above. Of special interest is the fabrication of precision nano-structures for which optical lithography typically may provide poor results. There are a range of conventional direct (i.e. maskless) fabrication methods that maybe used to directly pattern the final wafer at micro- or nano-sizes.

In one conventional maskless method, a focused ion beam (FIB) may be used to make micro- or nano-structures from a thin-film material deposited on a plain substrate. FIB may be used to mill features even smaller than 15 nm in a thin-film. However, such a method has the disadvantage of being very low throughput, which typically limits the practical device area to undesirably small sizes (e.g. <1 cm$^2$).

In another conventional maskless method, Electron Beam Lithography (EBL) may be used to fabricate micro- or nano-structures. The process typically involves: (i) coating a substrate with a thin-film material, (ii) electron beam lithography to make openings in a resist that is spun on the thin-film, and (iii) reactive ion etching to etch through the thin-film that is not protected with the resist. Another typical process involves: (i) electron beam lithography to make openings in a resist that is spun on the substrate, (ii) coating the resist and the openings with a thin-film material, and (iii) lifting-off the material that is deposited on the resist by dissolving the resist in appropriate chemicals. EBL has a higher throughput compared to FIB; and that makes fabrication of larger area devices possible. However, EBL has the disadvantage of being too slow and too expensive for directly fabricating many large area micro and nano-structured devices.

In another conventional maskless method, interference lithography may be used to fabricate micro- or nano-structures. The process typically involves: (i) coating a substrate with photoresist, (ii) one-step or few-step interference lithography followed by resist development to yield periodic resist structures on the substrate, (iii) thin-film material deposition, and (iv) lift-off the thin-film from photoresist. Interference lithography is faster than EBL, and it can yield fast patterning of larger areas. However, interference lithography is considerably restricted in the shape and precision of the final patterns possible to make, and the materials which are compatible for this process.

In another conventional method, polystyrene nanospheres are self-assembled on a substrate. Subsequent reactive ion etching may be used to shrink the size of spheres to desired value. Thin-film material deposition on the spheres and lift-off yields periodic micro- or nano-structures. However, such nanosphere lithography is typically limited in control over the type of fabricated structures and their uniformity.

Such typical conventional processes rely on well-established micro- or nano-fabrication techniques to yield a single device or plurality of devices that share a single host wafer. That means to make another copy of the same device, almost the entire process must be undesirably repeated, which typically is a significant limitation for industrial scale production of desirably inexpensive large devices. However, the above conventional techniques or others in the art may be used to yield a single expensive master wafer with a template of patterns that may be replicated to many cheap copies using one of the known conventional replication methods.

In one conventional replication method, nanoimprint lithography may be used to replicate the micro- or nano-structures of an expensive master which is made by one of the conventional techniques listed above or others known in the art. The process typically involves: (i) bringing a polymer/resin in contact with the master surface and curing it in place, (ii) peeling off the hardened polymer/resin from the master. The peeled polymer/resin will carry a replica of the patterns on its surface. The process can be repeated many times to get many cheap replicas from a single master.

In another conventional replication method, soft lithography may be used to replicate the micro- or nano-structures of an expensive master. The process typically involves: (i) making a soft replica of a master wafer by nanoimprint lithography, (ii) coating the target substrate with a photoresist, (iii) bringing the soft replica in conformal contact with the target wafer, and (iv) UV exposure. Developing the exposed resist will result in a replica of the master to the target substrate.

In another conventional replication method, roll-to-roll nanoimprint lithography (also known as 'cast and cure', 'roll-to-roll UV casting', and 'roll-to-roll embossing') may be used to replicate the micro- or nano-structures of an expensive master. The process typically involves: (i) replicating a master into a flexible copy using nanoimprint lithography, soft lithography, etc. and/or further processing the copy to a metal (e.g. Ni) shim, and (ii) rolling the flexible copy over a mold roller which is pressed against a back roller. Similar to a printing machine, a thin substrate moves between the two rollers where it receives a copy of the patterns through a thermal or UV process. The massive throughput of a roll to roll process can cheaply replicate micro- and nano-patterns over a giant surface at a high speed. A variation of the same process can be implemented in a plate-to-roll format.

Such conventional replication techniques and others in the art typically provide a resin/plastic copy of a typically expensive master. One still needs to employ metal/material deposition, lift-off, etching, etc. to yield a final device that includes a micro or nano-structured thin-film material. Any process that can yield a micro or nano-structured thin-film material that is more cost effective than those known in the art, and without the use of lift-off or etching is of high industrial value, because it can reduce the cost and complexity of the manufacturing process.

In one conventional method to avoid lift-off or etching, template stripping may be used to selectively remove parts of a thin-film material otherwise uniformly deposited over template (a master or a replica of a master). The process typically involves: (i) coating the template with a thin-film material, (ii) pressing the coated template against a plastic substrate while heating the sandwiched materials to a temperature above a glass transition temperature of the plastic, and (iii) peeling of the cooled plastic. The process results in the transfer of a micro or nano structured thin-film material to plastic, leaving behind the thin-film in valleys of the template. The method leverages the poor adhesion of the thin-film to the template, and the good adhesion of the thin-film to the softened plastic.

Conventional template stripping may be implemented in different variants. In one variant a UV curable resin is applied over the thin-film coated template to strip the deposited thin-film. In another variant, an adhesive is applied over the thin-film coated template to strip the deposited thin-film. In another variant, the template is cleaned and reused at the start of each thin-film deposition and stripping cycle. In another variant, the ultra-smooth surface formed at thin-film and template interface is brought to the top functional surface of the final perforated thin-film enhancing the final device performance. In another variant, nano-tips for applications in near-field optical microscopy, nano-focusing, or others are fabricated using template stripping. In another variant, all the thin-film material deposited over the template is transferred to a target substrate to yield a very smooth textured surface.

All the variants of template stripping, whether used for stripping the entire thin-film deposited on the template to make a very smooth surface, or used for stripping selected metal surface to make a micro- or nano-structured material, typically rely on specifically "poor" adhesion of the deposited thin-film material to the underlying template and a "strong" adhesion of the thin-film to an applied resin/adhesive layer for removal. It avoids lift-off or etching, and yields a low cost and more environmentally friendly process. However, such striping techniques typically rely on the use of adhesives to keep the final product on the final substrate, and the template typically needs to be cleaned and prepared before each use. Accordingly, such stripping techniques typically undesirably limit the structural robustness of the final product, the maximum throughput of an industrial implementation of the process, the selection of template material and/or its anti-adhesion surface treatment, and the type of deposited thin-film material.

Accordingly, there is a need for additional and improved methods of fabrication of micro- or nano-structured thin-films on substrate surfaces which may desirably allow for reducing the manufacturing expense per unit area of the desired micro- or nano-structures. Furthermore, there is a need for additional and improved methods of fabrication of micro- or nano-structured thin-films on substrate surfaces which may desirably increase the fabrication throughput. There is also a need for additional and improved methods of fabrication of micro- or nano-structured thin-films on substrate surfaces which may desirably increase the product robustness and the range of possible used materials.

SUMMARY

Embodiments of the present invention relate to methods for fabricating micro- and/or nano-structure from a thin-film material deposited and adhered to a template defining the micro- or nano-structures, while avoiding lift-off or etching.

According to one embodiment of the present invention, a method of fabricating (i) a perforated thin-film comprising micro- or nano-structure perforations on a substrate surface, and (ii) shaped and positioned micro- or nano-particles encapsulated in a substrate is provided. The method of fabrication comprises the steps of:

a) providing a micro- or nano-structure template comprising a substrate surface and raised micro- and/or nano-structures extending above the substrate surface;

b) depositing a single or a few thin-film coating(s) of a first stack of suitable coating material(s) over the substrate and raised micro- or nano-structures such that the thin-film coating(s) is substantially adhered to layer over which they are deposited on, forms a thin-film cap, such as an overhanging thin-film cap, on the raised micro- or nano-structures, and the total thin-film thickness is less than the height of the micro- or nano-structures above the substrate surface;

c) depositing a layer of a potting material (e.g. a UV curable resin) over the first stack of thin-film coating(s) on the substrate and raised micro- or nano-structures such that the potting material is substantially weakly adhered to the last deposited thin-film;

d) hardening or curing the potting material such that the hardened potting material encapsulates the thin-film caps on the raised micro- or nano-structures; and e) removing the hardened potting material from the first stack of thin-film coated template such that the thin-film caps remain encapsulated in the hardened potting material, to reveal: (i) a perforated thin-film coated substrate, wherein the thin-film is perforated at the locations of the micro- or nano-structures of the template, and (ii) micro- or nano-particles encapsulated in the hardened potting material, wherein the particles are at the locations of the micro- or nano-structures of the template and take their shapes.

According to an alternative embodiment of the present invention, step e) of the above-described method may optionally further comprise:

e) removing the hardened potting material from the first stack of thin-film coated substrate such that the thin-film caps and raised micro or nano-structures are removed with the hardened potting material, to reveal: (i) a perforated thin-film coated substrate, wherein the thin-film is perforated at the locations of the micro or nano-structures of the template, and (ii) micro- or nano-particles encapsulated in the hardened potting material, wherein the particles are at the locations of the micro- or nano-structures of the template and take their shapes.

According to another embodiment of the present invention, the method of fabricating a perforated thin-film comprising micro- or nano-structure perforations on a substrate surface additionally comprises:

f) depositing a single or a few thin-film coating(s) of a second stack of suitable coating material(s) over the substrate and raised micro- or nano-structures such that the second thin-film coating(s) is substantially adhered to the layer over which they are deposited on and forms a second thin-film cap on the raised micro- or nano-structures;

g) depositing a layer of a potting material over the second stack of thin-film coating(s) on the substrate and raised micro- or nano-structures such that the potting material is substantially weakly adhered to the last deposited thin-film;

h) hardening or curing the potting material such that the hardened potting material encapsulates the second thin-film caps on the raised micro- or nano-structures; and i) removing the hardened potting material from the second stack thin-film coated substrate such that the second thin-film caps remain encapsulated in the hardened potting material, to reveal: (i) a perforated first and second stack thin-film coated substrate, wherein the thin-film stacks are perforated at the locations of the micro- or nano-structures of the template, and (ii) micro- or nano-particles from the second thin-film stack encapsulated in the hardened potting material, wherein the particles are at the locations of the micro- or nano-structures of the template and take their shapes.

According to a further embodiment of the present invention, another method of fabricating (i) a perforated thin-film comprising micro- or nano-structure perforations on a substrate surface, and (ii) shaped and positioned micro- or nano-particles encapsulated in a substrate is provided. The method of fabrication comprises the steps of:

a) providing a micro- or nano-structure template comprising a substrate surface and raised micro- or nano-structures extending above the substrate surface;

b) depositing a single or a few thin-film coating(s) of a first stack of suitable coating material(s) over the substrate and raised micro- or nano-structures such that the thin-film coatings are substantially adhered to the material over which they are deposited, and the overall thin-film thickness is less than the height of the micro- or nano-structures above the substrate surface;

c) depositing a layer of a potting material over the thin-film coating on the substrate and raised micro- or nano-structures such that the potting material is substantially weakly adhered to the last deposited thin-film;

d) hardening or curing the potting material such that the hardened potting material encapsulates the thin-film coated raised micro- or nano-structures, thereby interlocking the thin-film coated raised micro- or nano-structures with the hardened potting material; and e) removing the hardened potting material from the thin-film coated substrate such that the thin-film coated overhanging raised micro- or nano-structures remain encapsulated in the hardened potting material, to reveal: (i) a perforated thin-film coated substrate, wherein the thin-film is perforated at the locations of the micro- or nano-structures of the template, and (ii) micro- or nano-particles encapsulated in the hardened potting material, wherein the particles are at the locations of the micro- or nano-structures of the template and take their shapes.

In one embodiment of the present invention, the template can be the master wafer or the replica of a master wafer. In one embodiment of the present invention, the template material maybe semiconductor, glass, quartz, resin, plastic, or any other proper material. In one embodiment of the present invention, the template may already include additional device layers before application of the invented process. In one embodiment of the present invention, the template may include a single pattern or a plurality of patterns. In one embodiment of the present invention, the template may or may not be treated with adhesion control layers before deposition of the thin-film material. In one embodiment of the present invention, the template may contain both peaks and valleys types of structures. In one embodiment of the present invention, the thin-film coating may be deposited on the substrate surface by at least one of spin coating, chemical vapor deposition, physical vapor deposition, and atomic layer deposition. In another embodiment, the thin-film may comprise at least one of: a metal such as silver, gold, aluminum, copper, titanium, chromium; a dielectric such as, silicon dioxide, titanium dioxide, niobium oxide, a semiconductor, silicon, and any other material capable of strong adhesion to the substrate surface. In another embodiment, the potting material may comprise at least one of a curable resin, a curable resin or polymer, a UV curable resin or polymer, a thermally curable resin or polymer, a heat softened polymer, and a chemically curable resin or polymer. In another embodiment, the strength of adhesion between the thin-film and the substrate may be greater than the strength of adhesion between the thin-film and the potting material. In one embodiment of the present invention, the perforated thin-film remained in the template, or the thin-film micro- or nano-structures encapsulated by the potting material, or both can be the final useful product of the process. In one embodiment of the present invention, the final product of the invented method maybe further processed by or further used in conventional micro- or nano-fabrication processes.

BRIEF DESCRIPTION OF THE DRAWINGS

FIG. 6 illustrates a magnified perspective electron microscope view of an exemplary perforated thin-film coating on a substrate surface comprising nano-structure perforations following selective removal of thin-film coated caps from raised nano-structures, according to yet another embodiment of the present invention.

DETAILED DESCRIPTION

In one embodiment of the present invention, a method of fabrication is provided for producing (i) a perforated thin-film on a substrate surface, having micro- or nano-structure perforations, and (ii) shaped and positioned micro- or nano-particles encapsulated in a substrate.

In a particular embodiment of the present invention, a method of fabricating a perforated thin-film coating from a thin-film layer uniformly deposited on a template substrate having raised structures, such as micro- and/or nano-structure tops or apexes, may comprise the selective removal of top cap portion of the thin-film coating over the template by using a hardened resin or polymer potting material to encapsulate and subsequently remove the encapsulated micro- or nano-structure thin-film caps.

In another embodiment of the present invention, the removal of the hardened resin or polymer potting material including the encapsulated thin-film micro and/or nano-structure caps may desirably yield a perforated or patterned thin-film on the template (with the thin-film micro- or nano-structure caps removed), and/or also a hardened resin or polymer potting material layer comprising the shaped and positioned micro or nano-structure thin-film caps, which then comprise isolated shaped and positioned micro- or nano-structure particles.

In contrast with conventional template stripping for removing portions of a thin-film uniformly deposited over a micro- or nano-structured template, the embodiments of the present invention rely on desirably better adhesion (and preferably at least good adhesion) between the deposited thin-film (such as metal and/or dielectric material) to the micro- or nano-structured template surface, and the desirably poorer adhesion (and preferably at least weak adhesion) between the deposited thin-film and the hardened resin or polymer potting material applied over top the thin-film layer.

In one embodiment, the micro- or nano-structures may be originated on a master wafer using any suitable micro- or nano-structure fabrication method such as optical lithography, focused ion beam, electron beam lithography, interference lithography, nanosphere lithography for example. The template maybe the master wafer, or a replica of it fabricated using one of replication methods such as roll-to-roll nano-imprint lithography for example, and the thin-film material may be deposited by any suitable thin-film deposition methods, such as in a physical vapor deposition roll-coater for example, and the rest of the potting material deposition, hardening (such as by UV or other suitable curing of the potting material) and removal of the hardened potting material layer may be completed in roll-to-roll machinery. Therefore, in one such embodiment, the selective template removal (template snatching) may desirably be applied to yield large-scale micro or nano-perforated films and micro- or nano-structure particle devices at a desirably improved high-throughput and reduced cost.

Figure 1:
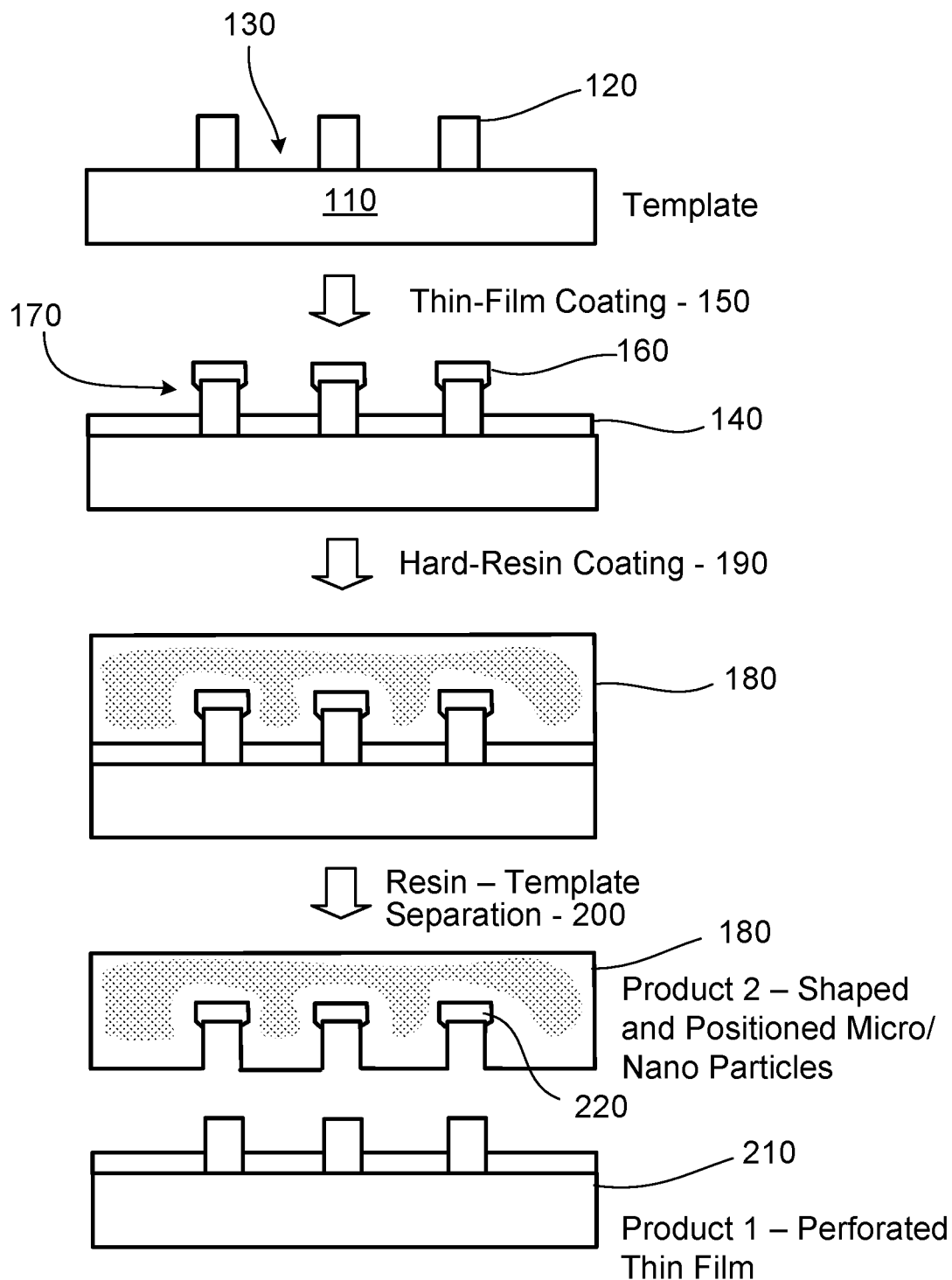
FIG. 1 illustrates a cross-sectional schematic view of a method of fabricating (i) a perforated thin-film comprising micro- or nano-structure perforations on a substrate surface, and (ii) shaped and positioned micro- or nano-particles encapsulated in a substrate, according to an embodiment of the present invention.

Referring to FIG. 1, a cross-sectional schematic view of a method of fabricating a perforated thin-film comprising micro/nano structure perforations on a substrate surface is illustrated, according to an embodiment of the present invention. In one such embodiment, the selective template removal method comprises first providing a micro and/or nano structure template 110 that has raised structures, such as micro or nano patterned structures 120 on its surface 130. In one embodiment, the micro/nano structure template can be made using any suitable micro/nano structure fabrication method, such as according to a wafer origination process or can be a replica of a master wafer. In one embodiment, next a thin-film layer 140 with thickness smaller than the height of the raised patterned structures 120 is deposited on the surface 130 of the template 110 in a thin-film deposition step 150. The thin-film layer 140 deposited may desirably have a strong adhesion to the template 110. The thin-film layer 140 maybe a single layer or a plurality of layers each desirably have a strong adhesion to the material they are deposited on. Any suitable thin-film deposition method capable to provide a strongly adhered thin-film layer 140 on the template 110 may be applied, such as a physical vapor deposition or other suitable method that results in formation of micro or nano-structures, such as thin film caps or "islands" 160. In an embodiment, the thin-film caps 160 have an overhang 170. In an embodiment, each of the overhangs are sized desirably at least a little larger than the raised structures 120 of the template substrate 110, and in some embodiments, resemble such "mushroom" shaped overhanging thin-film caps.

In one embodiment, the thin-film coated template 110 is then further coated by a thick curable potting material 180 in a potting material coating step 190 that when hardened or cured will exhibit poor adhesion to the deposited thin-film layer 140. The thickness of the potting material is larger than the height of the raised patterned structures 120. The curable potting material can be any suitable curable resin and/or polymer potting material, may in one aspect desirably provide for being hardened using standard time, thermal and/or UV curing techniques, for example. In one embodiment, the hardened potting material 180 may desirably surround and encapsulate (such as by mechanically interlocking or "grabbing" the 3D shape of) the thin-film caps 160 of the thin-film material.

In one aspect, a selective template removal (maybe named "template snatching") step 200 may desirably mechanically separate the hardened potting material (such as a UV cured resin or polymer for example) 180 from the template 110, so as to desirably leave the coated thin-film layer 140 adhered to the flat surface 130 as the thin-film layer 140 preferentially adheres more strongly to the template 110 than to the potting material 180 coated over the thin-film layer 140. In a particular embodiment, the same mechanical selective template removal step 200 desirably also selectively removes or "snatches" the overhanging thin-film caps 160 from the template 110 as the thin-film caps 160 (or "island-like" portions of the thin-film layer coated on a top portion of each of the plurality of raised structures) are encapsulated or mechanically interlocked within corresponding cavities in the hardened potting material 180.

In one embodiment, such selective template removal step 200 may desirably result in two micro/nano structure devices. In one aspect, the first such device may comprise a micro/nano structure patterned perforated thin-film 210 comprising a plurality of micro/nano structure perforations. In an embodiment, each of the plurality of micro-/nano-structure perforations correspond to the location of each of the plurality of raised structures 120 of the template 110. The second such device may comprise a hardened potting material layer 180 comprising a plurality of precisely shaped and positioned nano/micro structure particles 220 (comprising the selectively removed overhanging thin-film caps 160) encapsulated within the hardened potting material layer 180.

In one such embodiment, both micro/nano structure devices can be used in many applications, such as, for example: plasmonic devices, metamaterial devices, membranes (e.g. in separation, fuel cells, liquid filters, gas filters, and others), optical filters, textured electrical electrodes, patterned contacts, patterned electronic/optical circuits, sensors (e.g. bio-sensors, gas detectors, refractive index sensors, fluid sensors, molecule detectors, and others), optical polarizers, displays (in devices like televisions, monitors, cell-phones, laptops, wearable electronics, and others), and document security features, for example.

Figure 2:
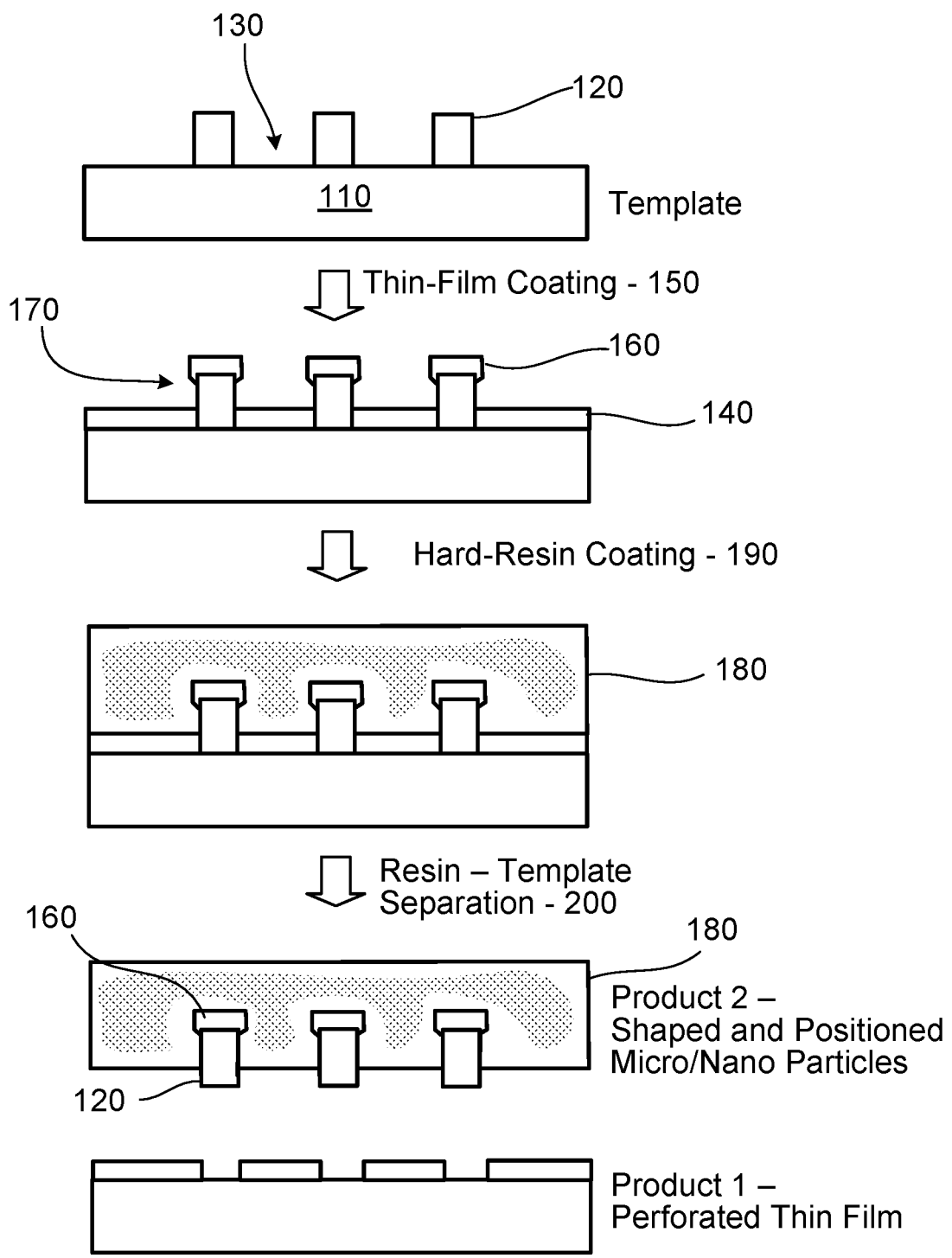
FIG. 2 illustrates a cross-sectional schematic view of a method of fabricating (i) a perforated thin-film comprising micro- or nano-structure perforations on a substrate surface, and (ii) shaped and positioned micro- or nano-particles encapsulated in a substrate, according to another embodiment of the present invention.

A first variation of the selective template removal (i.e. template snatching) is illustrated in FIG. 2. The process steps are substantially like that of FIG. 1. However, the thin-film caps 160 are strongly adhered to the surface 120 of the template 110 such that the mechanical separation 200 (or template snatching) of the hardened potting material 180 from the template 110 results in breaking and separating each of the raised structures 120 from the surface 130 of the template 110 together with the thin-film caps 160. In spite of this minor difference, the products of this process can be substantially similar to that of FIG. 1.

Figure 3:
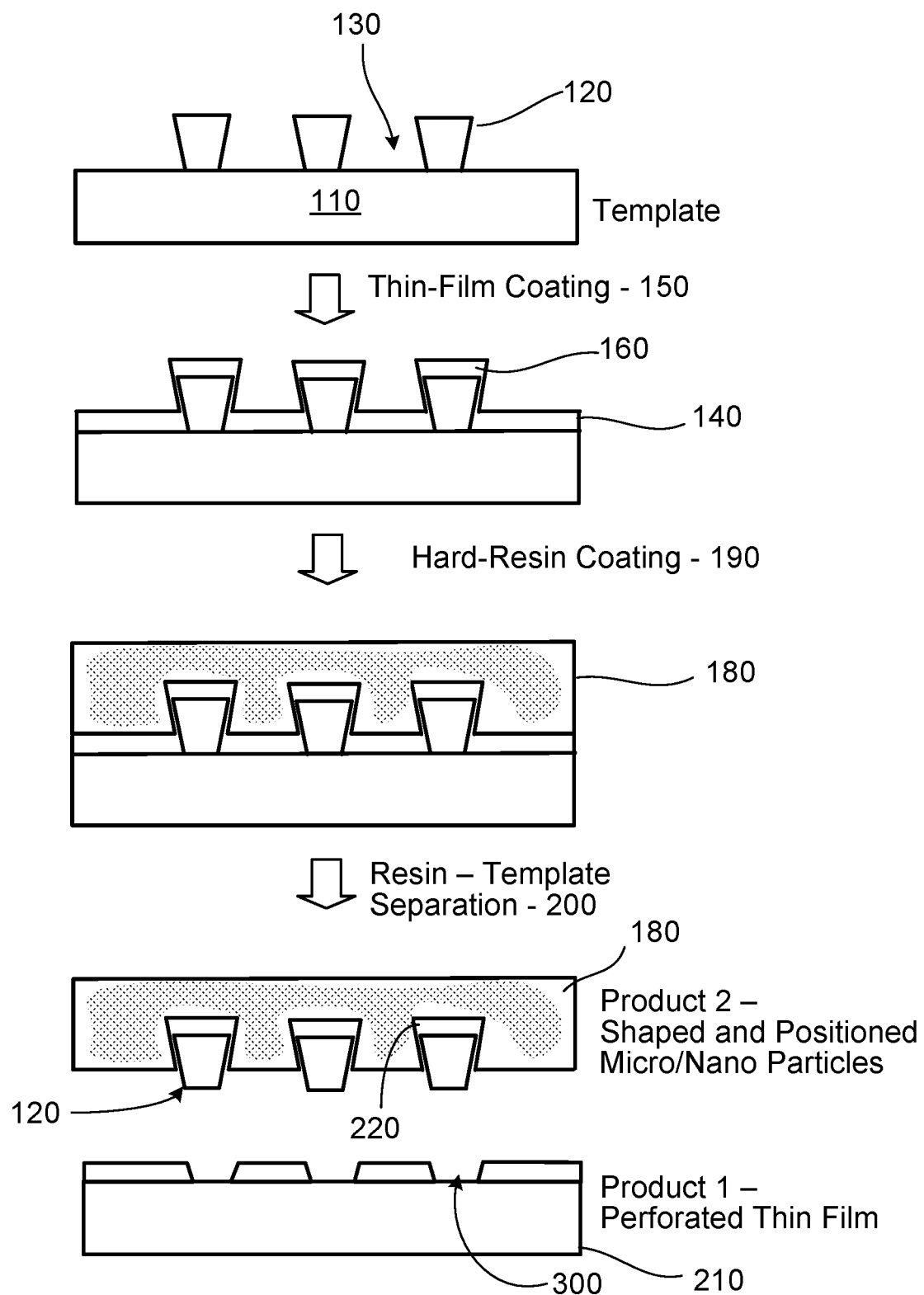
FIG. 3 illustrates a cross-sectional schematic view of a method of fabricating (i) a perforated thin-film comprising micro- or nano-structure perforations on a substrate surface, and (ii) shaped and positioned micro- or nano-particles encapsulated in a substrate, according to a further embodiment of the present invention.

A second variation of the selective template removal (i.e. template snatching) is illustrated in FIG. 3. The process steps are exactly like that of FIG. 1. However, the thin film deposited on a top portion of each of the raised structures 120 do not need to form a size larger than the size of the raised structures themselves. That is, each of the thin-film caps 160 do not require an overhang 170 as in the variation shown in FIG. 1. Instead, each of the plurality of raised structures 120 are shaped to have an overhanging profile that provides mechanical means for the potting material 180 to harden and encapsulate them. Like FIG. 2, here the mechanical separation of the hardened potting material 180 from the template 110 results in breaking and separating of each of the plurality of raised structures 120 from the surface 130 of the template 110 together with the thin-film caps 160. In spite of this minor difference, the end products of this process are substantially similar as that of FIG. 1 and FIG. 2.

Figure 4:
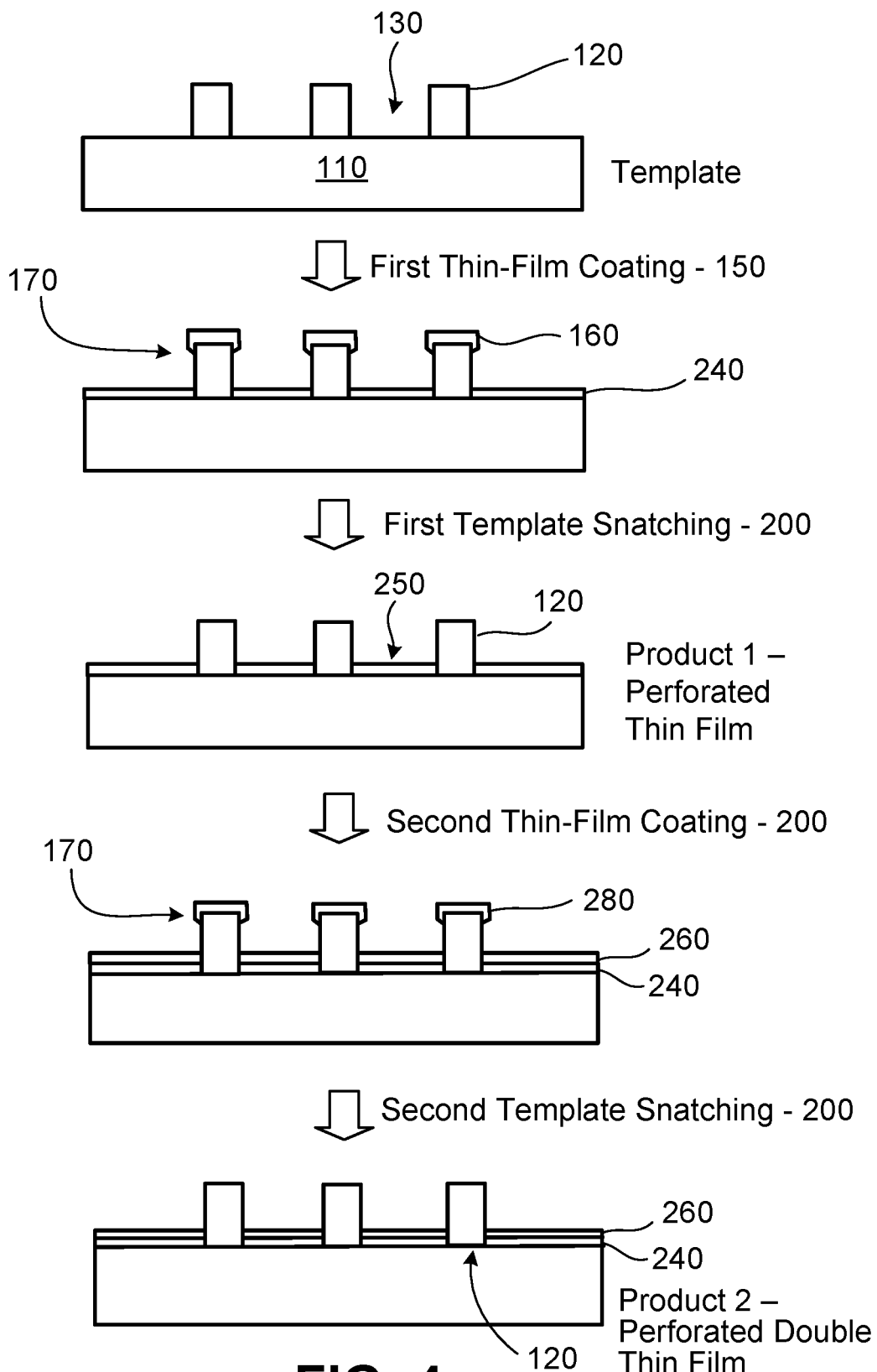
FIG. 4 illustrates a cross-sectional schematic view of a method of fabricating a perforated multi-layer thin-film comprising micro- or nano-structure perforations on a substrate surface, according to a further embodiment of the present invention.

FIG. 4 illustrates another embodiment of the selective template removal (i.e. template snatching). The template 110 is layered or covered with a first thin-film layer 240 which upon application of the first template snatching step 200 yields a first perforated thin-film 250 over the template 110. The first perforated thin-film 250 is then covered again with a second or subsequent thin-film layer 260 followed by a second template snatching to produce a second or subsequent perforated thin-film 260. This process may be repeated in order to produce multiple layers of perforated thin-films.

As shown, the initial thin-film deposition step 150 may commence with depositing a first thin-film layer 240 in a thickness smaller than the height of the raised structures 120 on the template 110. In addition to the earlier steps for fabricating a product having perforated thin-film comprising micro and/or nano-structure perforations, a second or subsequent thin-film layer 260 of a second suitable coating material is deposited over the substrate and raised 120 such that the second thin-film layer 260 is adhered to the first thin-film layer 240 and forms second or subsequent overhanging thin-film cap 280 on a top portion of each of the plurality of raised structures 120. In an embodiment, a second or subsequent layer of a potting material is deposited over the second thin-film layer 260 and allowed to harden or cure. The hardening or curing of the potting material is such that the hardened potting material encapsulates the second or subsequent overhanging thin-film caps 280. The removing of the hardened potting material reveals a second or subsequent perforated thin-film 260 layered over the first perforated thin-film, wherein the perforations correspond to the locations of each of the plurality of raised structures 120.

Figure 5A:
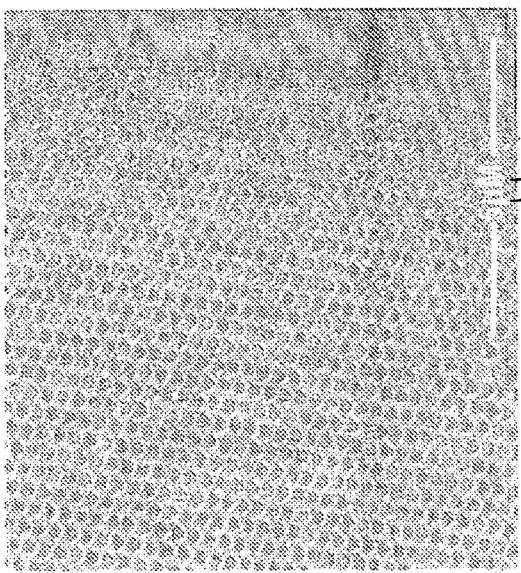
FIG. 5a illustrates a perspective electron microscope view of an exemplary thin-film coated template comprising raised nano-structures, according to an embodiment of the present invention.
Figure 5B:
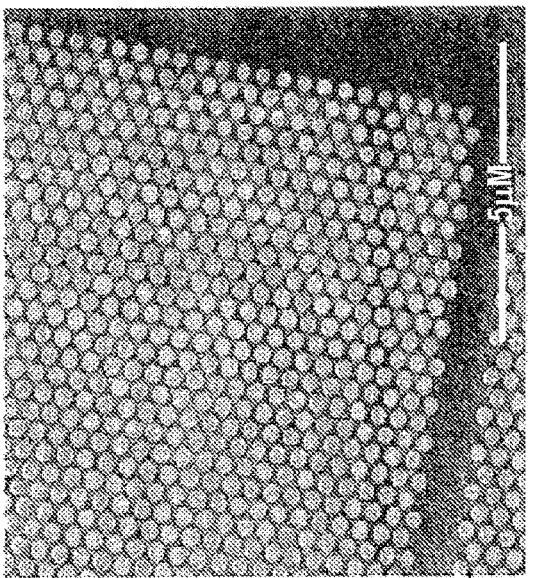
FIG. 5b illustrates a perspective electron microscope view of an exemplary perforated thin-film on a substrate surface comprising nano-structure perforations following selective removal of thin-film coated caps from raised nano-structures of a template, according to another embodiment of the present invention.
Figure 5C:
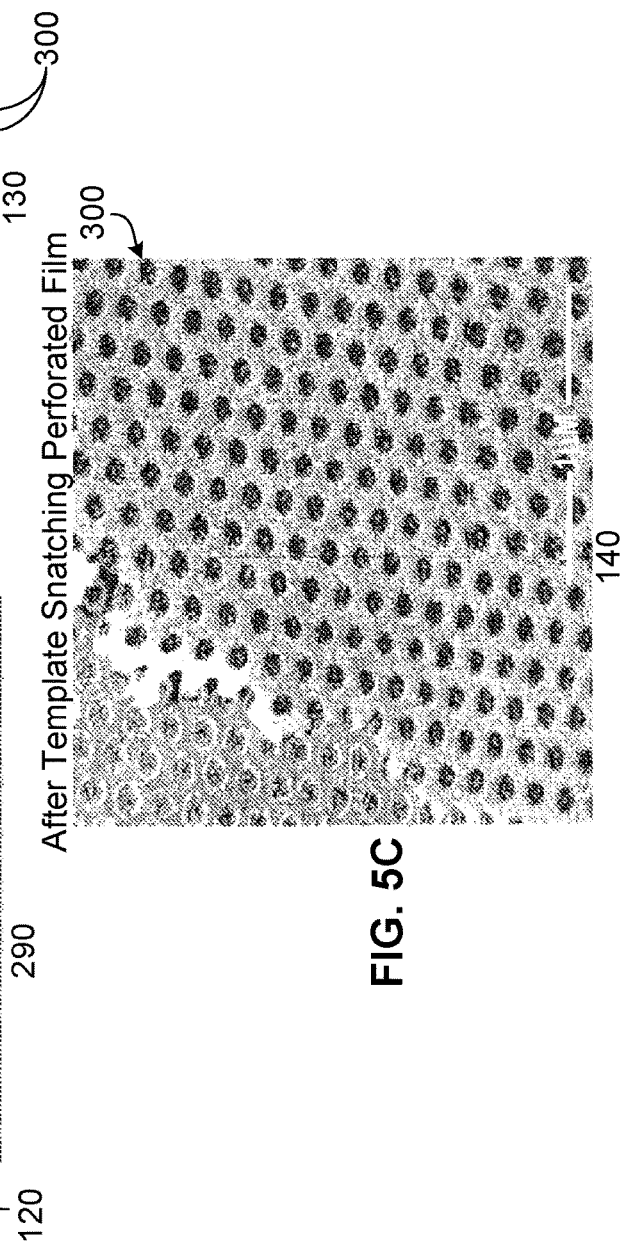

FIGS. 5a and 5b illustrate enlarged scanning electron microscope images of the perforated film formed by the method illustrated in FIG. 2. FIG. 5a illustrates a perspective electron microscope view of an exemplary thin-film coated nanostructure template on a template surface comprising raised nano-structures 290 having a thin-film layer, according to an embodiment of the present invention. FIG. 5b illustrates a perspective electron microscope view of an exemplary perforated thin-film layer on a template surface 130 comprising nano-structure perforations 300 following selective removal of thin-film coated caps from raised nanostructures, according to another embodiment.

FIG. 6 shows a scanning electron microscope image of the result of a template snatching process. Here, a thin-film layer, such as 30 nm of aluminum, was deposited on a template having a periodic arrangement of nano-structures, such as nano-pillars, on its surface (see left side FIG. 6). The template was made through a master wafer origination and nano-imprint lithography. Snatching the aluminum layer deposited on the nano-pillar template using a hard UV cured resin resulted in a perforated aluminum thin-film left on the template (see right side FIG. 6).

In a further embodiment, the template used in the above described methods of selective template removal may comprise an original micro/nano structured template wafer that has gone through all the fabrication steps, or a replica of a master wafer replicated with known methods including nanoimprint lithography. In an embodiment where nanoimprint lithography is used, a suitable nano-imprint lithographical method may be applied, such as for example plate to plate, plate to roll, or roll-to-roll methods. In embodiments, the template or master wafer may be made by optical lithography, electron-beam lithography, focused-ion-beam, laser interference, or a recipe of any other suitable micro- or nano-fabrication techniques.

In an embodiment, the template material maybe semiconductor, glass, quarts, resin, plastic, metal or other suitable materials, and can include arbitrary shaped features with sizes less than 10 μm.

Although the figures herein illustrated a single pattern, in an embodiment, the template can comprise a single or a plurality of patterns of different shapes, sizes, and heights.

In an embodiment, the template may or may not be treated with adhesion control layers before deposition of the thin-film material to assist in adhesion of the thin-film layer on the substrate surface.

In an embodiment, the template may contain both raised and lowered micro/nano-structures, such as peaks and valleys. The thin-film material deposited on top portions of each of the plurality of raised structures (i.e. apexes) will be removed by template snatching. The material left in the valleys will be left on the template and may provide additional functionality to the final device.

In embodiments, the material of the thin-film layer deposited can be metals like silver, aluminum, gold, copper, titanium; or dielectrics like $SiO_2$, $TiO_2$, $Nb_2O_5$; or semiconductors like Si; or any material with strong adhesion to the surface of the template, and the deposition method may be physical vapor deposition or any other method suitable to deposit thin-film with the characteristics demanded by the application.

In one embodiment, for each selective template removal or template snatching step, a single layer or multiple layers of the thin-film material may be deposited.

In one embodiment, the resin can be thermally cured, UV cured, molten plastic, or anything that satisfies the hardness and adhesion properties needed.

In one embodiment, the selective template removal or template snatching process may be implemented in roll to roll, plate to plate, or plate to roll format, either manually or through design/use of appropriate machinery.

In one embodiment, the devices of the template snatching may be further processed by deposition of more layers and/or etching steps and/or other micro/nano fabrication steps to yield the final devices.

In one embodiment, the final product may be used as an etch mask or on optical mask to manufacture further products and devices.

In one embodiment, the selective template removal, or template snatching process may be repeated more than once to yield multiple layers of nano or microstructure thin-film layers.

In one embodiment, the final micro/nano structured devices resulting from the above-described selective template removal methods may comprise plasmonic devices, metamaterials, including thin-film colour shifting devices useful to function as optically variable devices for document security.

In one embodiment, the final devices may comprise plasmonic or metamaterials devices useful to generate structural colors such as for environmentally friendly die-free prints. In one embodiment, the final devices may be used as an optical polarizer and/or optical filter. In one embodiment, the final devices may function as sensors for refractive index, fluids, gasses, molecules, bio-materials, and others. In one embodiment, the final devices may be used as membranes in separation, fuel cells, liquid or gas filters, and others. In one embodiment, the final devices may be used in construction of displays or devices like TVs, monitors, cell-phones, laptops, wearable electronics, and others.

In one aspect, the template of micro-/nano-structures may comprise substantially micro-/nano-structure features, such as micro-/nano-cylinders, or micro-/nano-cuboids or grooves, for example. In further aspects of the present invention, the original micro-/nano-structures according to the above described methods may comprise at least one of: multiple periodic arrays of micro-/nano-structures comprising different micro-/nano-structure dimensions and/or array periodicities and/or array types (i.e. rectangular, hexagonal, and other geometrical arrays); non-periodic or periodic arrays of micro-/nano-structures comprising different micro-/nano-structure dimensions arranged in arbitrary positions; multiple combinations of different arrays of different micro-/nano-structures; multiple arrays of different configurations or shapes of micro-/nano-structures such as one or more of micro-/nano-pillars or columns, micro-/nano-cones, micro-/nano-wires, micro-/nano-domes, micro-/nano-ridges, micro-/nano-pyramids, micro-/nano-holes, elongated micro-/nano-holes, micro-/nano-slots and micro-/nano-grooves, for example. In yet a further embodiment of the present invention, the original micro-/nano-structures according to the above described methods may comprise any desired combination, geometries or configurations of 2D (such as in-plane) and/or 3D (such as out of plane) micro-/nano-structures and/or grids or arrays thereof on the surface of the template substrate.

The above description of exemplary embodiments of the present invention, including what is described in the Abstract, is not intended to be exhaustive or to limit the embodiments of the invention to the precise forms disclosed above. Although specific embodiments and examples are described herein for illustrative purposes and to allow others skilled in the art to comprehend their teachings, various equivalent modifications may be made without departing from the scope of the disclosure, as will be recognized by those skilled in the relevant art.

What is claimed is:

1. A method of fabricating (i) a perforated thin-film comprising micro or nano-structure perforations on a substrate surface, and (ii) shaped and positioned micro or nano-particles mechanically interlocked in a substrate, the method of fabrication comprises the steps of:
   a) providing a micro or nano structure template comprising a substrate surface and raised micro or nano structures extending above the substrate surface;
   b) depositing one or more thin-film coating(s) of a first stack of suitable coating material(s) over the substrate and raised micro or nano structures such that the thin-film coating(s) is substantially adhered to a layer over which they are deposited on, and forms an island-like overhanging thin-film cap on the raised micro or nano structures;

c) depositing a layer of a curable material over the first stack of thin-film coating on the substrate and raised micro or nano structures such that the curable material at least partially surrounds an overhanging portion of the overhanging thin-film caps;

d) hardening or curing the curable material such that the hardened curable material mechanically interlocks the overhanging portion of the overhanging thin-film caps on the raised micro or nano structures; and e) removing the hardened curable material from the thin-film coated substrate such that the overhanging portion of the overhanging thin-film caps remain surrounded by the hardened curable material by mechanically interlocking the overhanging portion of the overhanging thin-film caps into the hardened curable material, to reveal: (i) a perforated thin-film coated substrate, wherein the thin-film is perforated at the locations of the micro or nano-structures of the template, and (ii) micro or nano-particles mechanically interlocked in the hardened curable material, wherein the particles are at the locations of the micro or nano-structures of the template and take their shapes.

2. The method according to claim 1, wherein step e) comprises:

e) removing the hardened curable material from the first stack of thin-film coated substrate such that the overhanging thin-film caps and raised micro or nano-structures are removed with the hardened curable material, to reveal: (i) a perforated thin-film coated substrate, wherein the thin-film is perforated at the locations of the micro or nano-structures of the template, and (ii) micro or nano-particles mechanically interlocked in the hardened curable material, wherein the particles are at the locations of the micro or nano-structures of the template and take their shapes.

3. The method according to claim 1 or 2, additionally comprising:

f) depositing a one or more thin-film coating(s) of a second stack of suitable coating material(s) over the substrate and raised micro or nano-structures such that the second thin-film coating(s) is substantially adhered to the layer over which they are deposited on and forms an overhanging second thin-film cap on the raised micro or nano-structures;

g) depositing a second layer of a curable material over the second stack of thin-film coating on the substrate and raised micro or nano structures such that the curable material at least partially surrounds an overhanging portion of the overhanging second thin-film caps;

h) hardening or curing the curable material such that the hardened curable material mechanically interlocks the overhanging portion of the overhanging second thin-film caps on the raised micro or nano structures; and i) removing the hardened curable material from the second stack thin-film coated substrate such that the overhanging portion of the overhanging second thin-film caps remain surrounded by the hardened curable material, to reveal: (i) a perforated first and second stack thin-film coated substrate, wherein the thin-film stacks are perforated at the locations of the micro or nano-structures of the template, and (ii) micro or nano-particles from the second thin-film stack mechanically interlocked in the hardened curable material, wherein the particles are at the locations of the micro or nano-structures of the template and take their shapes.

4. The method of claim 1, wherein the thin-film coating is deposited on the substrate surface by at least one of spin coating, chemical vapor deposition, physical vapor deposition, and atomic layer deposition.

5. The method of claim 1, wherein the raised micro or nano structures comprise a height above the substrate surface, and where the stack of thin-film comprises a thickness and wherein the height of the micro or nano structures is greater than the thickness of the stack of thin-film.

6. The method of claim 1, wherein the curable material comprises at least one of a thermally softened polymer, a curable resin or polymer, a UV curable resin or polymer, a thermal curable resin or polymer, and a chemically curable resin or polymer.

7. The method of claim 1, wherein the thin-film coating has better adhesion to the substrate surface than it has to the curable material.

8. The method of claim 1, wherein a first strength of adhesion between the thin-film(s) and the layer over which it is deposited on is greater than a second strength of adhesion between the last deposited thin-film and the curable material.

9. The method of claim 1, wherein the thin-film comprises at least one of: a metal, silver, gold, aluminum, copper, titanium, chromium, a dielectric insulator, silicon dioxide, titanium dioxide, niobium oxide, a semiconductor, silicon, and a material capable of strong adhesion to the layer over which it is deposited on.

10. A method of fabricating (i) a perforated thin-film comprising micro or nano-structure perforations on a substrate surface, and (ii) shaped and positioned micro or nano-particles mechanically interlocked in a substrate, the method of fabrication comprises the steps of:

a) providing a micro or nano structure template comprising a substrate surface and raised overhanging micro or nano structures extending above the substrate surface;

b) depositing a one or more thin-film coating(s) of a first stack of suitable coating material(s) over the substrate and overhanging raised micro or nano-structures such that the thin-film coatings are substantially adhered to the material over which they are deposited on;

c) depositing a layer of a curable material over the thin-film coating on the substrate and raised micro or nano structures such that the curable material at least partially surrounds an overhanging portion of the overhanging raised micro or nano-structures;

d) hardening or curing the curable material such that the hardened curable material mechanically interlocks the thin-film coated overhanging portion of the overhanging raised micro or nano structures, thereby mechanically interlocking the thin-film coated overhanging raised micro or nano structures with the hardened curable material; and e) removing the hardened curable material from the thin-film coated substrate such that the thin-film coated overhanging raised micro or nano-structures remain surrounded by the hardened curable material, to reveal: (i) a perforated thin-film coated substrate, wherein the thin-film is perforated at the locations of the micro or nano-structures of the template, and (ii) micro or nano-particles mechanically interlocked in the hardened curable material, wherein the particles are at the locations of the micro or nano-structures of the template and take their shapes.

* * * * *